(12) United States Patent
Shin et al.

(10) Patent No.: US 6,800,177 B2
(45) Date of Patent: Oct. 5, 2004

(54) APPARATUS AND METHOD FOR FABRICATING CARBON THIN FILM

(75) Inventors: Kyung-Ho Shin, Seoul (KR); Steven Kim, Harrington Park, NJ (US)

(73) Assignee: Plasmion Corporation, Hobokon, NJ (US)

( * ) Notice: Subject to any disclaimer, the term of this patent is extended or adjusted under 35 U.S.C. 154(b) by 30 days.

(21) Appl. No.: 10/369,534

(22) Filed: Feb. 21, 2003

(65) Prior Publication Data

US 2004/0011641 A1 Jan. 22, 2004

(30) Foreign Application Priority Data

Jul. 19, 2002 (KR) ........................................ 2002-42521

(51) Int. Cl.$^7$ ............................................. C23C 14/34
(52) U.S. Cl. ........................... 204/192.16; 204/192.15; 204/298.07; 204/298.09
(58) Field of Search ....................... 204/192.16, 192.15, 204/298.07, 298.09, 298.12, 298.13

(56) References Cited

U.S. PATENT DOCUMENTS

| | | | | |
|---|---|---|---|---|
| 5,466,941 A | * | 11/1995 | Kim | 250/423 R |
| 5,852,303 A | * | 12/1998 | Cuomo et al. | 257/9 |
| 2002/0070357 A1 | * | 6/2002 | Kim et al. | 250/493.1 |
| 2003/0141187 A1 | * | 7/2003 | Sohn et al. | 204/298.07 |
| 2003/0146088 A1 | * | 8/2003 | Kim | 204/192.26 |
| 2004/0045810 A1 | * | 3/2004 | Kim | 204/192.11 |

* cited by examiner

*Primary Examiner*—Steven Versteeg
(74) *Attorney, Agent, or Firm*—Morgan, Lewis & Bockius, LLP

(57) ABSTRACT

An apparatus and method for fabricating a carbon thin film are disclosed in the present invention. The apparatus includes a vacuum chamber having a substrate mounted therein, a sputter target inside the vacuum chamber facing into the substrate, a cesium supplying unit inside the vacuum chamber in a shape of a shield to a circumference of the target and supplying cesium vapor onto a surface of the sputter target through a plurality of openings, and a heating wire surrounding the cesium supplying unit and maintaining the cesium supplying unit at a constant pressure.

26 Claims, 6 Drawing Sheets

APPARATUS AND METHOD FOR FABRICATING CARBON THIN FILM

This application claims the benefit of the Korean Application No. P2002-0042521 filed on Jul. 19, 2002, which is hereby incorporated by reference.

BACKGROUND OF THE INVENTION

1. Field of the Invention

The present invention relates to a thin film fabrication, and more particularly, to an apparatus and method for fabricating a carbon thin film. Although the present invention is suitable for a wide scope of applications, it is particularly suitable for forming a high density thin film and improving a deposition rate.

2. Discussion of the Related Art

Generally, when forming a carbon thin film, either a chemical vapor deposition (CVD) method using chemical reactions, or a sputtering method using physical collisions is used.

Being more advantageous in its uniformity in composition and thickness and its step coverage, the CVD method is more popular in fabrication processes of highly integrated semiconductor devices. A chemical source, a delivery system sending the chemical source to a reactor, a mass flow meter controlling the amount of the chemical source sent to the reactor, and a process chamber developing the chemical source into a thin film, such as a semiconductor thin film, through a chemical reaction are required for depositing thin film using the CVD method.

A gaseous chemical source is most generally used in the CVD method. However, when using a chemical source containing an element excessively high in atomic weight, it becomes difficult to form a gaseous chemical source. Therefore, a chemical source gas produced by vaporizing or sublimating a liquid or solid source through a vaporizer is used to deposit a thin film.

In general, the related art apparatus for sputtering includes a vacuum chamber having a substrate mounted therein to deposit a carbon thin film, an argon gas supplying unit supplying argon gas into the vacuum chamber, a target formed of graphite and spaced apart and facing into the substrate, and a power supply supplying power to the target.

In the above-described apparatus for sputtering, the vacuum chamber is filled with argon gas and a high voltage of DC or radio frequency (RF) voltage is applied to the target, so as to ionize the argon gas. The ionized argon gas collides with the target, thereby discharging carbon ions having momentum and accelerating energy. The carbon ions react on the surface of the substrate, thereby forming a thin film.

However, when using the above-described apparatus for depositing a thin film, a variety of gas supplied into the vacuum chamber is turned into active ions that are low in energy, so as to form a carbon thin film. Therefore, the adhesion of the thin film to the substrate becomes weak. This results in that the thin film may easily be detached from the substrate. In this case, the hardness of the carbon thin film tends to be lower than that of a CVD method.

In addition, when using the apparatus for sputtering, the sputtering of a target varies with the amount of introduced argon gas. However, the surface roughness, density, and interfacial characteristic vary with the sputtering of the target. In order to resolve this problem, supplementary equipment for producing an ion beam by using plasma may be used. However, even with this supplement, a high quality thin film is not formed.

SUMMARY OF THE INVENTION

Accordingly, the present invention is directed to an apparatus and method for fabricating a carbon thin film that substantially obviates one or more of problems due to limitations and disadvantages of the related art.

Another object of the present invention is to provide an apparatus and method for fabricating a carbon thin film, which has a low surface energy and enhanced hardness, surface roughness, and interfacial characteristic.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an apparatus for fabricating a carbon thin film includes a vacuum chamber having a substrate mounted therein, a sputter target inside the vacuum chamber facing into the substrate, a cesium supplying unit inside the vacuum chamber in a shape of a shield to a circumference of the target and supplying cesium vapor onto a surface of the sputter target through a plurality of openings, and a heating wire surrounding the cesium supplying unit and maintaining the cesium supplying unit at a constant pressure.

In another aspect of the present invention, an apparatus for fabricating a carbon thin film includes a vacuum chamber having a substrate mounted therein, a sputter target inside the vacuum chamber facing into the substrate, and a cesium supplying unit supplying cesium vapor (Cs) onto a surface of the sputter target from a central portion of the sputter target.

Herein, the cesium supplying unit includes a cesium storage unit storing cesium, a heating wire surrounding the cesium storage unit so as to heat or maintain the cesium storage unit at a constant temperature, and a cesium introduction tube supplying the cesium stored in the cesium storage unit to the surface of the target.

In a further aspect of the present invention, a method for fabricating a carbon thin film on a substrate includes maintaining a chamber at a constant vacuum pressure, vaporizing a cesium slurry formed of a mixture of liquid cesium and cesium-modernite, and concurrently introducing the vaporized cesium onto a sputter target and argon gas into the vacuum chamber in sputtering carbon ions from the sputter target, and forming the carbon thin film on the substrate from the sputtered carbon ions.

More specifically, the apparatus of the present invention vaporizes the cesium slurry formed of liquid cesium and cesium-modernite and supplies the vaporized cesium slurry to the target, and at the same time, introduces argon gas into the chamber so as to form a high quality diamond-like-carbon (DLC) thin film onto a hard disk.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incor- In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

Figure 1:
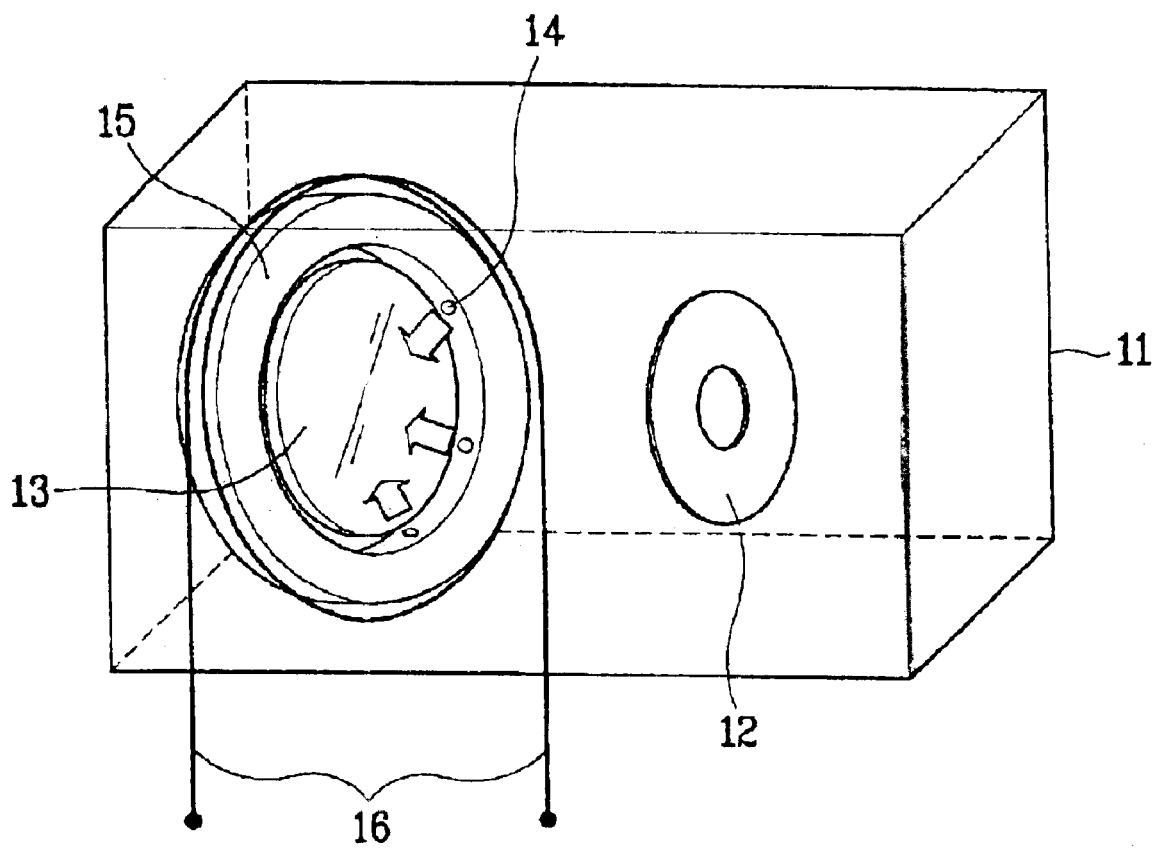
FIG. 1 illustrates a schematic view of an apparatus for fabricating a carbon thin film according to a first embodiment of the present invention.

FIG. 1 illustrates a schematic view of an apparatus for fabricating a carbon thin film according to a first embodiment of the present invention.

As shown in FIG. 1, a first embodiment of the apparatus for fabricating a carbon thin film according to the present invention includes a vacuum chamber 11, a substrate 12 placed inside the vacuum chamber 11 to deposit a thin film thereon, a target 13 placed inside the vacuum chamber 11 in the direction opposite to the substrate 12 in order to generate carbon ions, a cesium supplying unit 15 placed within a shield adjacent to a circumference of the target 13 and uniformly supplying cesium vapor onto a surface of the target 13 through a plurality of sprays 14, and a heating wire 16 surrounding the cesium supplying unit 15 and heating or maintaining the cesium supplying unit 15 at a constant temperature. Herein, the cesium supplying unit 15 is placed inside the vacuum chamber 11.

According to the first embodiment, although not shown in the drawings, the apparatus further includes a power supply supplying a high voltage of DC or radio frequency (RF) voltage to the target 13, an argon supply supplying argon gas into the vacuum chamber 11, and a vacuum pressure regulator regulating or maintaining the vacuum pressure within the vacuum chamber 11.

The substrate 12 is a substrate for forming a hard disk. A graphite target may be used as the target 13 in order to form a diamond-like-carbon (hereby referred to as "DLC") thin film. Herein, the target 13 is spaced apart from the substrate 12 at a distance ranging from about 5 to 7 cm.

The cesium supplying unit 15 is filled with a cesium slurry formed of a mixture from liquid cesium and cesium-modernite, which is vaporized and supplied to the surface of the target 13. The cesium supplying unit 15 includes a plurality of openings 14 at the inner circumferential surface in order to uniformly spray the cesium vapor onto the surface of the target 13. Additionally, the cesium supplying unit 15 is formed to surround the target 13, thereby guiding the carbon ions generated from the target 13 to the direction of the substrate 12.

The method for fabricating a carbon thin film using the above-described apparatus according to the present invention will now be described.

The vacuum pressure regulator is operated to maintain the vacuum pressure within the vacuum chamber 11 at about $10^{-6}$ Torr. Then, the heating wire 16 heats the cesium supplying unit 15, and the argon supply is operated. At this point, the argon supply supplies argon gas into the vacuum chamber 11 at an injection pressure of about 3 mTorr. And, a DC voltage of about 600 V is supplied to the target.

When the inside of the cesium supplying unit 15 reaches the range of about 70 to 100° C. the cesium slurry is vaporized. Then, due to an increase in the pressure within the cesium supplying unit 15, the vaporized cesium is discharged onto the surface of the target 13 through the openings 14. Since the cesium vapor is discharged through a plurality of openings 14, it is uniformly sprayed onto the surface of the target 13.

In addition, a portion of the vaporized cesium is deposited on the surface of the target, and the remaining portion of the vaporized cesium collides with the argon gas supplied by the argon supply, thereby positively ionizing a portion of the argon gas.

When colliding with the target 13, the positively charged argon ions transfer a high energy to the target particles. Then, the negatively charged target particles having a high energy, more specifically, carbon ions are generated and deposited onto the substrate 12.

Meanwhile, the cesium vapor lowers the work function of the surface of the target 13, thereby accelerating the negative ionization of the target particles.

The negative ionization rate of the target particles depends on the thickness of the cesium deposited on the target. More specifically, when the cesium vapor deposited on the target is either too thick or too thin, the negative ionization rate is reduced. The negative ionization rate is maximized when a half-atomic or a full atomic layer is deposited on the target.

The apparatus according to the present invention, therefore, accelerates the generation of negative ions having a high energy from the entire surface of the target evenly deposited with cesium vapor. Thus, a carbon thin film having a high density may be uniformly deposited on a large area substrate. In addition, a thin film has a smooth surface, and an interfacial characteristic is improved.

Due to the increase in adhesion with the substrate, the hardness of the thin film is improved. Also, the surface energy of the carbon thin film is reduced, thereby stabilizing the surface of the thin film.

Figure 2:
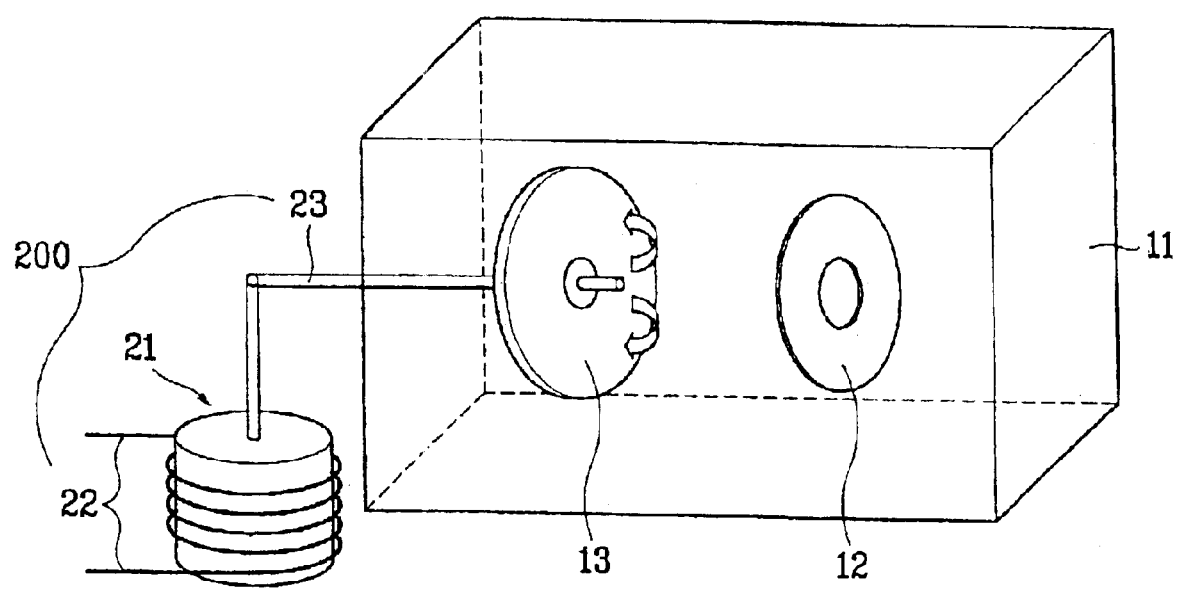
FIG. 2 illustrates a schematic view of the apparatus for fabricating a carbon thin film according to a second embodiment of the present invention.

FIG. 2 illustrates a schematic view of the apparatus for fabricating a carbon thin film according to a second embodiment of the present invention.

As shown in FIG. 2, a second embodiment of the apparatus for fabricating a carbon thin film according to the present invention includes a vacuum chamber 11, a substrate for forming a hard disk placed in a region inside the vacuum chamber 11 in order to deposit a thin film, a target 13 spaced apart from the substrate in an opposite direction at a distance ranging from about 5 to 7 cm and formed of graphite so as to generate carbon ions required for forming a DLC thin film, and a cesium supplying unit 200 installed to pass through the center of the target 13 and supply cesium (Cs) vapor onto the surface of the target 13. Herein, the cesium supplying unit 200 is placed inside the cesium chamber 11.

The second embodiment of the apparatus for fabricating a carbon thin film according to the present invention further includes a power supply, an argon supply, and a vacuum pressure supply.

Herein, the cesium supplying unit 200 includes a cesium storage unit 21 storing a cesium slurry formed of liquid cesium and cesium-modernite, a heating wire 22 surrounding the cesium storage unit 21 at a constant temperature, and a cesium introduction tube 23 supplying the cesium stored in the cesium storage unit 21 to the surface of the target 13.

The cesium storage unit 21 may be installed either outside or inside the vacuum chamber 11. In the above-described embodiments of the present invention, the cesium storage unit 21 is installed outside the vacuum chamber 11. The cesium introduction tube 23 passes through the center of the target 13 and protrudes from the target.

The method for depositing a thin film using the apparatus for fabricating a carbon thin film according to the second embodiment of the present invention will now be described.

The vacuum pressure regulator is operated to maintain the vacuum pressure within the vacuum chamber 11 at about $10^6$ Torr. Then, a heating wire 22 heats the cesium supplying unit 21, thereby operating the argon supply at the same time. At this point, argon gas is supplied to the vacuum chamber 11 at a pressure of 3 mTorr. A DC voltage of about 600V is then supplied to the target 13.

Furthermore, when the cesium storage unit 21 reaches a temperature ranging from about 200 to 320° C., the cesium slurry therein is vaporized due to the heat. With the increase in pressure within the cesium storage unit 21, the vaporized cesium is discharged through the cesium introduction tube 23 and onto the surface of the target 13.

The cesium gas and the argon gas provided with the surface of the target 13 induce the target particles (carbon ions) to be negatively ionized from the target 13 during a sputtering process. The target particles are then deposited onto the substrate 12 to form a carbon thin film.

The results of experiments carried out on the carbon thin film deposited by using the apparatus for fabricating a carbon thin film according to the present invention will now be described.

Figure 3:
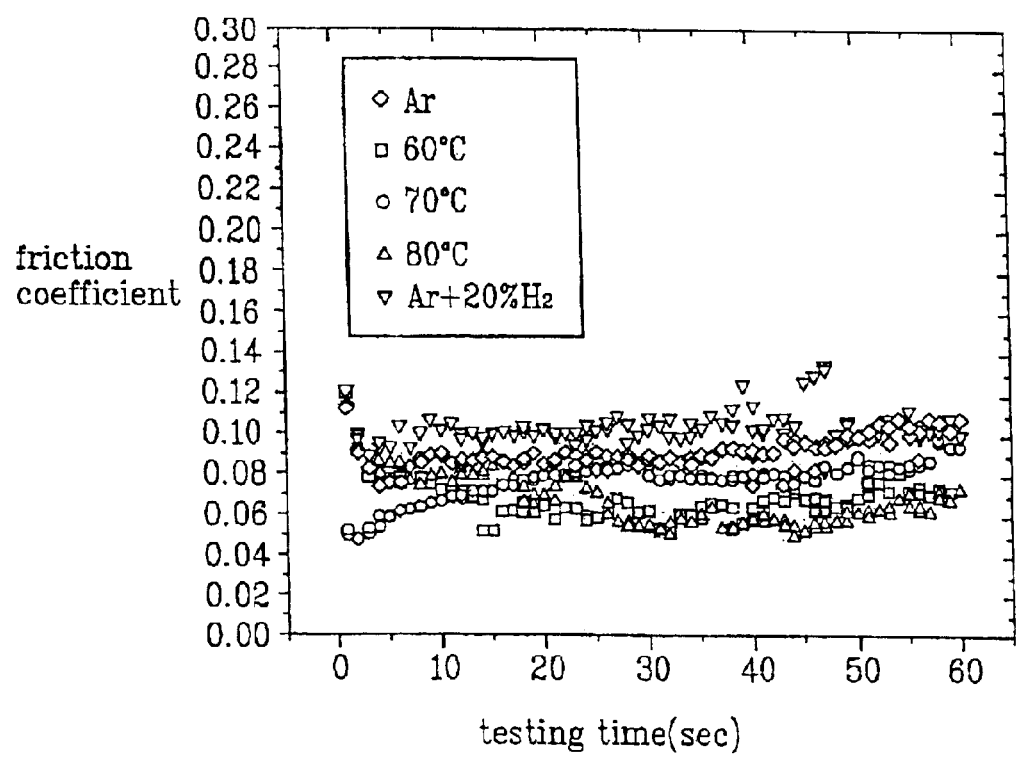
FIG. 3 is a graph illustrating friction coefficients of the carbon thin film deposited by using the apparatus according to the first embodiment.

FIG. 3 illustrates variations in the friction coefficient with the testing time of the carbon thin film deposited by the apparatus according to the present invention. More specifically, FIG. 3 shows the friction coefficient of carbon thin films deposited in an environment of pure argon, the friction coefficient of a carbon thin film deposited in an environment of hydrogen and argon gas, and the friction coefficients of carbon thin films deposited in an environment of argon gas and cesium at temperatures of 60, 70, and 80° C.

As shown in FIG. 3, the friction coefficient of the carbon thin film deposited in the environment of hydrogen and argon gas is the highest among them. The friction coefficient of the carbon thin film deposited in the environment of argon gas and cesium is lower than that of the carbon thin film deposited in the environment of pure argon.

Figure 4A:
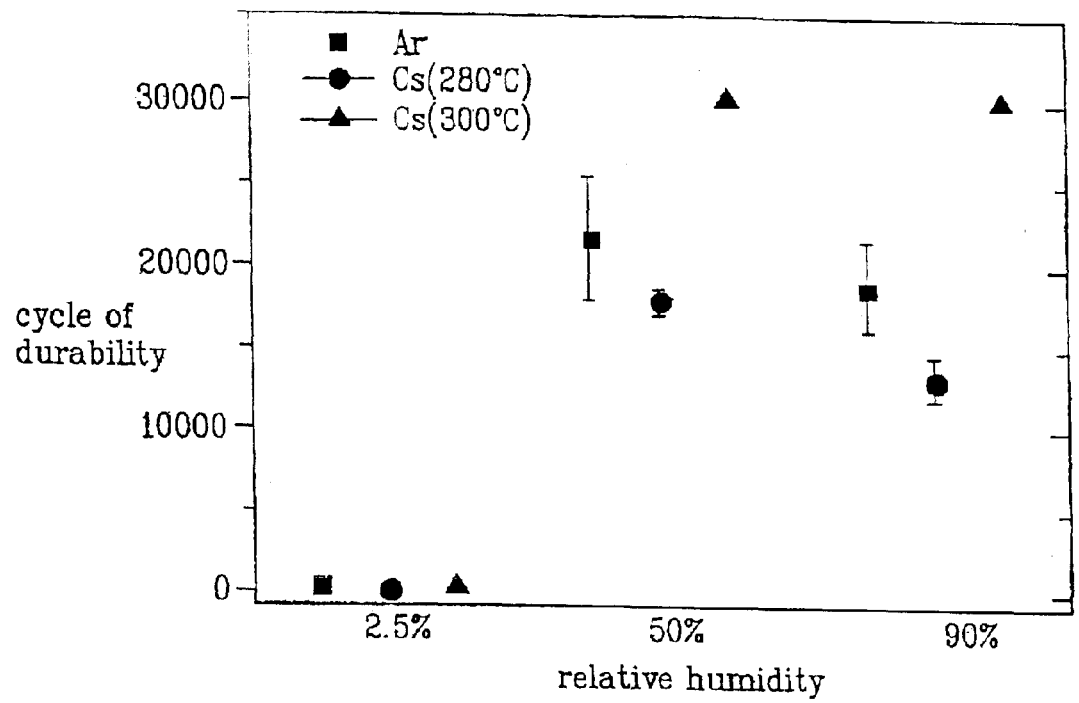
FIG. 4A is a graph illustrating a durability of the carbon thin film deposited by using the apparatus according to the second embodiment.
Figure 4B:
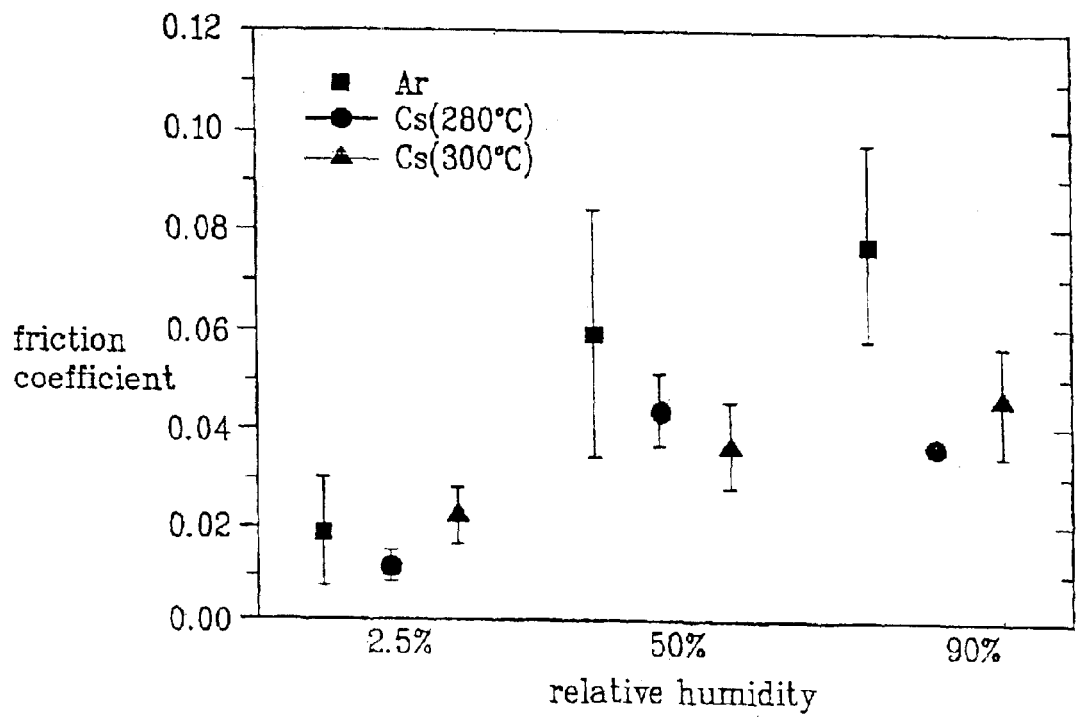
FIG. 4B is a graph illustrating friction coefficients of the carbon thin film deposited by using the apparatus according to the second embodiment.

FIGS. 4A and 4B each illustrate the durability and the friction coefficient of a carbon thin film deposited by using the apparatus for fabricating a carbon thin film according to the second embodiment of the present invention. More specifically, the graphs show the durability and the friction coefficient of the carbon thin film deposited in the environment of pure argon, and the durability and the friction coefficient of the carbon thin film deposited, in accordance with the relative humidity, when the cesium supplying unit is heated at temperatures of 280° C. and 300° C.

As shown in FIG. 4A, the friction force of the carbon thin film depends on the relative humidity. Nevertheless, the carbon thin film deposited in the environment of argon gas and cesium has a high wear resistance when the relative humidity of the thin film is high.

Additionally, as shown in FIG. 4B, in accordance with the increase in the relative humidity, the friction coefficient of the carbon thin film deposited in the environment of argon gas and cesium becomes lower than that of the carbon thin film deposited in the environment of pure argon.

Figure 5:
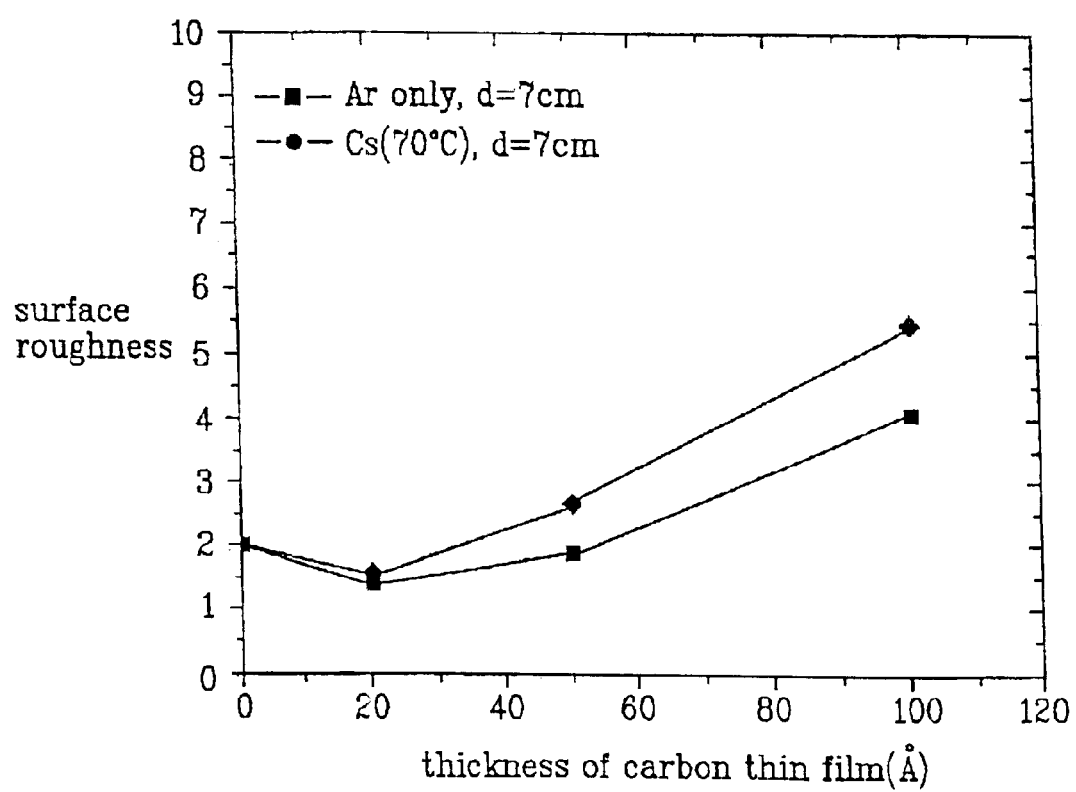
FIG. 5 is a graph illustrating a surface roughness of the carbon thin film deposited by using the apparatus according to the first embodiment.

FIG. 5 illustrates a surface roughness of a carbon thin film deposited by using the apparatus for fabricating a carbon thin film according to the first embodiment of the present invention, in accordance with the thickness of the thin film. The thin film is deposited in an environment, wherein the substrate 12 and the target 13 are spaced apart at an distance 'd' of about 7 cm, and the cesium supplying unit is about 70.

As shown in FIG. 5, the surface roughness of the carbon thin film is the lowest when the thin film has a thickness of about 20 Å. The surface roughness increases as the thin film becomes thicker. The surface roughness of the carbon thin film deposited by using cesium is lower than that of the carbon thin film deposited in the environment of pure argon.

Figure 6:
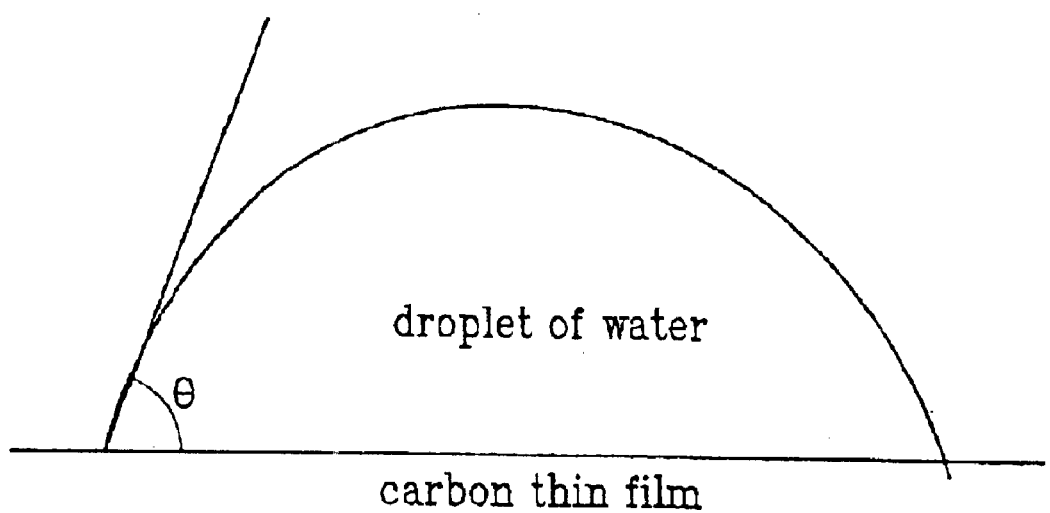
FIG. 6 illustrates a contact angle of a droplet of water onto the carbon thin film deposited by using the apparatus according to the present invention.

FIG. 6 is the contact angle of a droplet of water for illustrating the wettability of a carbon thin film deposited by using the apparatus for fabricating a carbon thin film according to the present invention. Table 1 describes the contact angle θ of the carbon thin film deposited in the environment of pure argon and the contact angle of the carbon thin film deposited in the environment of argon gas and cesium. The carbon thin film is deposited in the environment of argon gas and cesium, wherein the cesium storage unit 21 is 280 and 300° C.

The wettability of a carbon thin film deposited on a $SiO_2$ substrate is inversely proportional to the contact angle of a droplet of water. More specifically, when the contact angle is small, the wettability of the carbon thin film is high. And, when the contact angle θ is large, the wettability of the carbon thin film becomes low.

TABLE 1

| sputtering environment | contact angle (θ) |
| --- | --- |
| Ar | 78.1 |
| Ar + Cs (280) | 96.1 |
| Ar + Cs (300) | 95.6 |

As shown in Table 1, the carbon thin film deposited in the environment of argon gas and cesium using the apparatus for fabricating a carbon thin film according to the second embodiment has a larger contact angle than that of the carbon thin film deposited in the environment of pure argon. In other words, when cesium is added during the sputtering process, the surface energy of the carbon thin film is decreased, and the surface of the thin film is stabilized.

As described above, the apparatus and method for fabricating a carbon thin film according to the present invention simultaneously provides cesium gas, which accelerates the generation of negative ions, and argon. Thus, the target particles may be discharged as negative ions, thereby forming a high quality carbon thin film having a low surface energy and a stabilized surface.

Additionally, by providing cesium in close proximity to the target during the sputtering process, hardness, surface roughness, and interfacial characteristics are improved.

The above-described apparatus and method for fabricating a carbon thin film has the following advantages.

By simultaneously supplying cesium gas and argon gas to the surface of a target, the generation of negative ions of high energy is induced, thereby forming a thin film having a high density, a low surface energy, and a stabilized surface. Furthermore, a high quality thin film having improved hardness, surface roughness, and interfacial characteristics may be formed.

It will be apparent to those skilled in the art that various modifications and variations can be made in the apparatus and method for fabricating a carbon thin film of the present invention without departing from the spirit or scope of the inventions. Thus, it is intended that the present invention covers the modifications and variations of this invention provided they come within the scope of the appended claims and their equivalents.

What is claimed is:

1. An apparatus for fabricating a carbon thin film, comprising:
    a vacuum chamber having a substrate mounted therein;
    a sputter target inside the vacuum chamber facing into the substrate;
    a cesium supplying unit inside the vacuum chamber in a shape of a shield to a circumference of the target and supplying cesium vapor onto a surface of the sputter target through a plurality of openings; and
    a heating wire surrounding the cesium supplying unit and maintaining the cesium supplying unit at a constant pressure.

2. The apparatus of claim 1, wherein the substrate is for forming a hard disk.

3. The apparatus of claim 1, wherein the target is formed of graphite target.

4. The apparatus of claim 1, wherein the target is spaced apart from the substrate at a distance ranging from about 5 to 7 cm.

5. The apparatus of claim 1, wherein the cesium supplying unit is filled with a cesium slurry formed of a mixture of liquid cesium and cesium-modernite.

6. The apparatus of claim 1, wherein the cesium supplying unit vaporizes cesium at a temperature ranging from about 70 to 100° C.

7. The apparatus of claim 1, further comprising a power supply supplying power voltage to the target.

8. The apparatus of claim 7, wherein the power supply supplies a DC voltage of about 600V.

9. The apparatus of claim 1, further comprising an argon supply supplying argon gas into the vacuum chamber.

10. The apparatus of claim 1, further comprising a vacuum pressure regulator regulating a vacuum pressure within the vacuum chamber.

11. An apparatus for fabricating a carbon thin film, comprising:
    a vacuum chamber having a substrate mounted therein;
    a sputter target inside the vacuum chamber facing into the substrate; and
    a cesium supplying unit supplying cesium (Cs) vapor onto a surface of the sputter target from a central portion of the sputter target.

12. The apparatus of claim 11, wherein the substrate is for forming a hard disk.

13. The apparatus of claim 11, wherein the target is formed of graphite.

14. The apparatus of claim 11, wherein the target is spaced apart from the substrate at a distance ranging from about 5 to 7 cm.

15. The apparatus of claim 11, wherein the cesium supplying unit includes a cesium storage unit outside the vacuum chamber and stores a cesium slurry formed of a mixture of liquid cesium and cesium-modernite, a heating wire surrounding the cesium storage unit at a constant temperature, and a cesium introduction tube supplying the cesium stored in the cesium storage unit to a surface of the sputter target.

16. The apparatus of claim 11, wherein the cesium supplying unit vaporizes cesium at a temperature ranging from about 200 to 320° C.

17. The apparatus of claim 11, further comprising a power supply supplying power voltage to the target.

18. The apparatus of claim 17, wherein the power supply supplies a DC voltage of about 600V.

19. The apparatus of claim 11, further comprising an argon supply supplying argon gas into the vacuum chamber.

20. The apparatus of claim 11, further comprising a vacuum pressure regulator regulating a vacuum pressure within the vacuum chamber.

21. A method for fabricating a carbon thin film on a substrate, comprising:
    maintaining a vacuum chamber at a constant vacuum pressure;
    vaporizing a cesium slurry formed of a mixture of liquid cesium and cesium-modernite;
    concurrently introducing the vaporized cesium onto a sputter target and argon gas into the vacuum chamber for sputtering carbon ions from the sputter target; and
    forming the carbon thin film on the substrate from the sputtered carbon ions.

22. The method of claim 21, wherein the vacuum pressure is maintained at about 10–6 Torr.

23. The method of claim 21, wherein the cesium slurry is vaporized inside the vacuum chamber at a temperature ranging from about 70 to 100° C.

24. The method of claim 21, wherein the cesium slurry is vaporized outside the vacuum chamber at a temperature ranging from about 200 to 320° C.

25. The method of claim 21, wherein the argon gas is introduced into the vacuum chamber at an injection pressure of about 3 mTorr.

26. The method of claim 21, further comprising supplying a DC voltage of about 600V to the sputter target.

* * * * *